(12) United States Patent
Sugioka et al.

(10) Patent No.: US 7,430,106 B2
(45) Date of Patent: Sep. 30, 2008

(54) MATERIALS FOR FORMING CAPACITOR LAYER AND PRINTED WIRING BOARD HAVING EMBEDDED CAPACITOR CIRCUIT OBTAINED BY USING THE SAME

(75) Inventors: Akiko Sugioka, Ageo (JP); Naohiko Abe, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 11/662,402

(22) PCT Filed: Sep. 9, 2005

(86) PCT No.: PCT/JP2005/016610

§ 371 (c)(1),
(2), (4) Date: Mar. 9, 2007

(87) PCT Pub. No.: WO2006/028208

PCT Pub. Date: Mar. 16, 2006

(65) Prior Publication Data

US 2007/0263339 A1    Nov. 15, 2007

(30) Foreign Application Priority Data

Sep. 10, 2004 (JP) .............................. 2004-264741

(51) Int. Cl.
*H01G 4/008* (2006.01)
*H01G 4/005* (2006.01)
*H05K 1/18* (2006.01)

(52) U.S. Cl. ..................... 361/305; 361/303; 361/763
(58) Field of Classification Search .................. 361/303, 361/305
See application file for complete search history.

(56) References Cited

U.S. PATENT DOCUMENTS

| | | | |
|---|---|---|---|
| 6,477,302 B2 * | 11/2002 | Tatoh | 385/49 |
| 6,541,137 B1 * | 4/2003 | Kingon et al. | 428/701 |
| 6,623,865 B1 * | 9/2003 | Zou et al. | 428/472 |
| 6,649,930 B2 * | 11/2003 | Farrell | 257/43 |
| 7,199,470 B2 * | 4/2007 | Bogner et al. | 257/734 |

FOREIGN PATENT DOCUMENTS

| | | |
|---|---|---|
| JP | 10-098245 A | 4/1998 |
| JP | 2000-064084 A | 2/2000 |
| JP | 2001-355094 A | 12/2001 |
| JP | 2004-080060 A | 3/2004 |

* cited by examiner

*Primary Examiner*—Eric Thomas
*Assistant Examiner*—David M Sinclair
(74) *Attorney, Agent, or Firm*—Rothwell, Figg, Ernst & Manbeck, P.C.

(57) ABSTRACT

The object is to provide a material for forming a capacitor layer which is excellent in adhesion within a dielectric layer and a bottom electrode of a capacitor circuit. And to provide a material for forming a capacitor layer which has a new conductive layer for forming a bottom electrode capable of being used as an electrode serving also as a resistance circuit and the like. To solve the problem, the invention provides a conductive layer in which a pure nickel layer and a nickel-phosphorus alloy layer are deposited in order on a surface of a copper layer or a nickel-phosphorus alloy layer, a pure nickel layer and a nickel-phosphorus alloy layer are deposited in order on a surface of a copper layer, to assure excellent adhesion within the bottom electrode of a capacitor circuit and the dielectric layer in a printed wiring board having a dielectric layer between an top electrode and a bottom electrode.

7 Claims, 8 Drawing Sheets

(a)

(b)

(a)

(b)

(a)

(b)

(d)

(e)

(f)

(g)

(h)

(i)

(j)

MATERIALS FOR FORMING CAPACITOR LAYER AND PRINTED WIRING BOARD HAVING EMBEDDED CAPACITOR CIRCUIT OBTAINED BY USING THE SAME

TECHNICAL FIELD

The present invention relates to a material for forming an embedded capacitor layer in a printed wiring board and a printed wiring board with an embedded capacitor circuit obtained by using the material for forming a capacitor layer.

BACKGROUND ART

In a multilayer printed wiring board with embedded capacitor circuit (element), one or more insulating layers as an inner layer of the multilayer printed wiring board have been used as dielectric layers. As disclosed in Patent Document 1, circuits having a top electrode and a bottom electrode arranged to face each other on both sides of an inner-layer circuit are used as a capacitor circuit. Therefore, such capacitor circuit has been called an embedded capacitor circuit.

Capacitors are required to have the largest capacitance as possible for basic quality because they have been saved excess electric power and the like in electronic and electrical equipment. The capacitance (C) of a capacitor is calculated by the equation $C = \varepsilon \varepsilon_0 (A/d)$ ($\varepsilon_0$ is a permittivity in a vacuum). In particular, such a demand has been required on printed wiring boards also because of the recent trends for miniaturization of electronic and electrical equipment. However, it is clear that there is a limit in improvement with surface area (A), because it is almost impossible to ensure a wide area of a capacitor electrode in a given area of a printed wiring board. Therefore, to increase the capacitance of a capacitor, in the given surface area (A) of a capacitor electrode and the specific permittivity ($\varepsilon$) of a dielectric layer, reducing the thickness (d) of a dielectric layer or arrangement in the layer construction of the whole capacitor circuit are required.

[Patent Document 1] U.S. Pat. No. 6,541,137

However, when a nickel-phosphorus alloy layer is provided on a surface of a bottom electrode, the problem of de-lamination between a dielectric layer and the nickel-phosphorus alloy layer caused by poor adhesion between a dielectric layer and the nickel-phosphorus alloy layer may sometimes occur. It may increase capacitance deviation from the specified capacitance and it may not meet with designated quality. Furthermore, the insufficient adhesion can be a trigger of de-lamination in a printed wiring board. Also it can be a cause of interlayer de-lamination due to thermal shocks in solder reflow and the like or de-lamination due to heat generation in operation, which are causes of shorter product life.

Therefore, a material for forming a capacitor layer having a new conductive layer for forming a bottom electrode with excellent adhesion with a dielectric layer which is capable for use as an electrode and also serves as a resistance circuit and the like was required in the market.

DISCLOSURE OF THE INVENTION

Hence the present inventors devoted themselves to research and as a result, they have reached the idea that good adhesion between a dielectric layer and a bottom electrode can be obtained by using the following material for forming a capacitor layer. Moreover, by using the material for forming a capacitor layer, which will be described later, the capacitance of a capacitor circuit is also improved.

The material for forming a capacitor layer related to the present invention is a material for forming a capacitor layer of a printed wiring board which has a dielectric layer between a first conductive layer used for forming a top electrode and a second conductive layer used for forming a bottom electrode, which is characterized in that the second conductive layer is a conductive layer in which a pure nickel layer and a nickel-phosphorus alloy layer are deposited in order on a surface of a copper layer.

The material for forming a capacitor layer related to the present invention is a material for forming a capacitor layer of a printed wiring board which has a dielectric layer between a first conductive layer used for forming a top electrode and a second conductive layer used for forming a bottom electrode, which is characterized in that the second conductive layer is a conductive layer in which a nickel-phosphorus alloy layer, a pure nickel layer and a nickel-phosphorus alloy layer are deposited in order on a surface of a copper layer.

It is preferred that the nickel-phosphorus alloy layer used for the material for forming a capacitor layer related to the present invention has a phosphorus content of 0.05 wt % to 5 wt %.

It is preferred that the nickel-phosphorus alloy layer in the material for forming a capacitor layer related to the present invention has a thickness of 0.1 µm to 2.0 µm.

It is preferred that the pure nickel layer in the material for forming a capacitor layer related to the present invention has a thickness of 0.3 µm to 3.0 µm.

Use of the material for forming a capacitor layer related to the present invention enables formation of a bottom electrode having excellent adhesion with a dielectric layer, so that a printed wiring board can be obtained having a high-quality embedded capacitor circuit in which de-lamination between the dielectric layer and the bottom electrode does not occur.

The second conductive layer used for forming the bottom electrode of the material for forming a capacitor layer related to the present invention shows excellent adhesion with the dielectric layer. So by using this second conductive layer, it is possible to obtain a printed wiring board having a high-quality embedded capacitor circuit in which the de-lamination between the dielectric layer and the bottom electrode does not occur. In addition, the capacitance of a capacitor circuit formed by using the material for forming a capacitor layer related to the present invention is increased and it is possible to form a high-quality embedded capacitor circuit. Incidentally, it is clearly stated here that the dielectric layer of the material for forming a capacitor layer related to the present invention can be any dielectric layer formed in any methods including the so-called sol-gel method or a paste coating method in which a dielectric-filler-containing organic resin solution which contains a dielectric filler and a binder resin is used for coating.

BEST MODE FOR CARRYING OUT THE INVENTION

Figure 1:
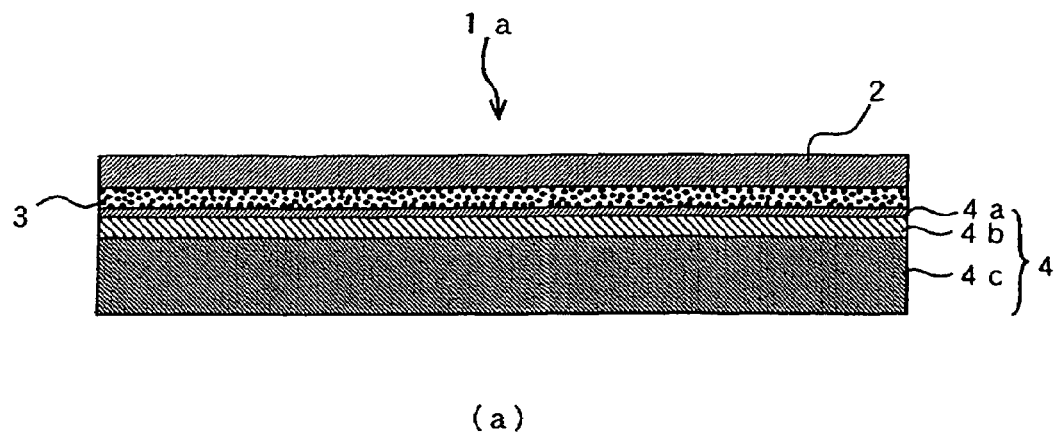
FIGS. 1 (*a*) and 1(*b*) are schematic sectional views of a material for forming a capacitor layer (first variation)
Figure 1:
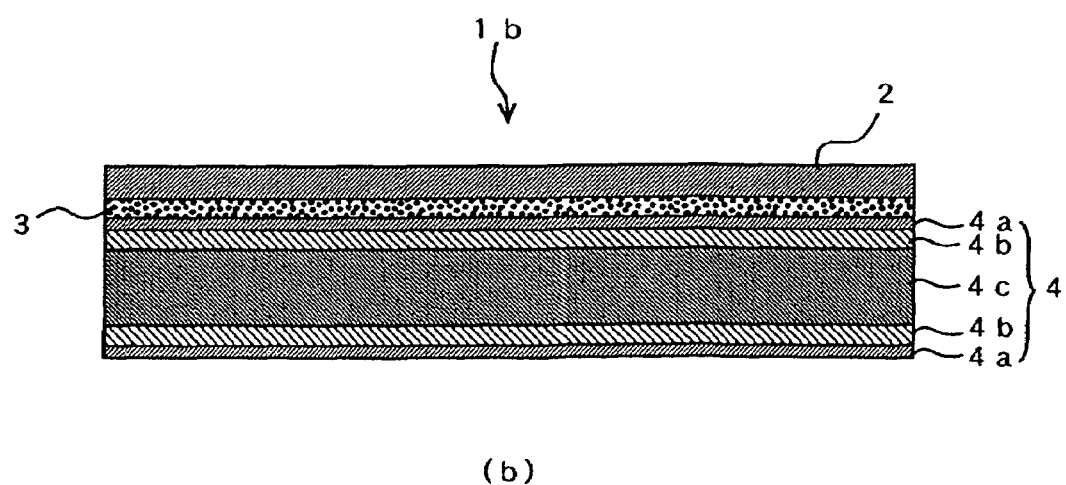

The present invention will be described below in further detail through a mode for carrying out the invention and an embodiment.

Modes of the Invention

The first embodiment of the material for forming a capacitor layer related to the present invention is characterized in that, as described above, a material for forming a capacitor layer of a printed wiring board having a dielectric layer between a first conductive layer and a second conductive layer, and in the second conductive layer, a pure nickel layer and a nickel-phosphorus alloy layer are deposited in order on a surface of a copper layer. FIGS. 1(a) and 1(b) show variations of materials for forming capacitor layer 1a, 1b related to the present invention. They are schematic sectional views which show the arrangement relationship of a first conductive layer 2, a dielectric layer 3 and a second conductive layer 4, and the layer construction of the second conductive layer 4 composed of a nickel-phosphorus alloy layer 4a, a pure nickel layer 4b and a copper layer 4c.

As is apparent from FIGS. 1 (a) and 1 (b), in the second conductive layer mentioned here is required only that the pure nickel layer 4b and the nickel-phosphorus alloy layer 4a be present on a contact surface between the second conductive layer 4 and the dielectric layer 3. Therefore, the pure nickel layer 4b and the nickel-phosphorus alloy layer 4a may be deposited in order on one surface or both surfaces of the copper layer 4c.

Figure 2:
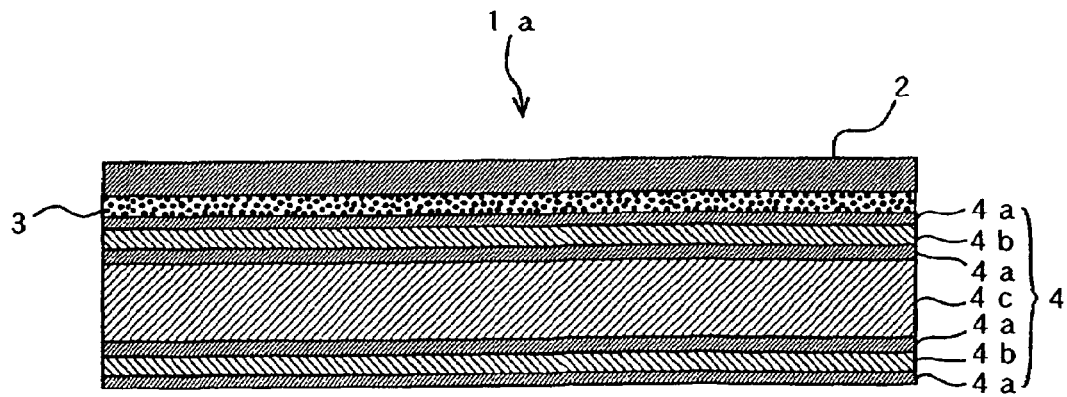
FIG. 2 is a schematic sectional view of a material for forming a capacitor layer (second variation)

The second embodiment of the material for forming a capacitor layer related to the present invention is characterized in that a material for forming a capacitor layer of a printed wiring board which has a dielectric layer between a first conductive layer and a second conductive layer, as described above, and the second conductive layer is a conductive layer in which a nickel-phosphorus alloy layer, a pure nickel layer and a nickel-phosphorus alloy layer are deposited in order on a surface of a copper layer. FIG. 2 shows an embodiment of a material for forming a capacitor layer 1c related to the present invention. It is a schematic sectional view which shows the arrangement relationship of a first conductive layer 2, a dielectric layer 3 and a second conductive layer 4, and the layer construction of the second conductive layer 4 composed of a nickel-phosphorus alloy layer 4a, a pure nickel layer 4b and a copper layer 4c. As is apparent from a comparison between FIGS. 1(a) and 1(b) and FIG. 2, in the second variation, a nickel-phosphorus alloy layer 4a is added between the copper layer and the pure nickel layer of the first variation.

The expanding and shrinking behavior caused by heating and cooling observed by a TMA analysis in the nickel-phosphorus alloy layer and the pure nickel layer is quite different. In the nickel-phosphorus alloy layer, an expanding curve by heating and a shrinking curve by cooling, are almost the same. The expanding curve and the shrinking curve do not change and are almost the same even after heating and cooling cycles are applied several times. In contrast to this, in the pure nickel layer, an expanding curve by heating and a shrinking curve by cooling are different like a hysteresis curve. When heating and cooling cycles are applied several times, the expanding curve and the shrinking curve tend to change in time by time. That is, by providing a further nickel phosphorus alloy layer, it is possible to further improve the adhesion between the dielectric layer and the bottom electrode even when a high-temperature heat cycle and a heatshock are applied.

Therefore, by using a layer construction as in the second embodiment, providing a further nickel-phosphorus alloy layer between the copper layer and the pure nickel layer, it is possible to obtain more stable adhesion between the dielectric layer and the bottom electrode than in the first embodiment even after a heat cycle in the manufacturing process of both a material for forming a capacitor layer and a printed wiring board.

The copper layer of the material for forming a capacitor layer can be formed by using electrodeposited copper foil or by using various methods, such as vapor deposition and plating. And for the pure nickel layer and nickel-phosphorus alloy layer which are formed on a surface of the copper layer, it is possible to use any method selected from electrochemical plating methods, such as the electrolytic plating method and the electroless plating method, and dry coating methods, such as the sputtering deposition method.

For example, when the sputtering deposition method is used, it is possible to selectively make the pure nickel layer and the nickel-phosphorus alloy layer by adjusting target compositions of a pure nickel target, a nickel-phosphorus alloy target and the like, which are used as a target.

In contrast to this, when the electrolytic plating method is used, it is possible to use the compositions for plating solutions and electrolysis conditions as described below. To form a pure nickel layer, it is possible to select solutions widely from nickel plating solutions that are well known. Examples are shown below. (i) use of nickel sulfate, the nickel concentration of 5 to 30 g/l, the solution temperature of 20 to 50° C., pH of 2 to 4, and the current density of 0.3 to 10 A/dm². (ii) use of nickel sulfate, the nickel concentration of to 30 g/l, the potassium pyrophosphate concentration of 50 to 500 g/l, the solution temperature of 20 to 50° c., pH of 8 to 11, and the current density of 0.3 to 10 A/dm². (iii) use of nickel sulfate, the nickel concentration of to 70 g/l, the boric acid concentration of 20 to 60 g/l, the solution temperature of 20 to 50° c., pH of 2 to 4, and the current density of 1 to 50 A/d². And use solution of popular Watt bath condition or else.

For a nickel-phosphorus alloy layer, nickel-phosphorus alloy can be obtained by using phosphoric-acid-based solutions. In this case, the following conditions can be used. (i) the nickel sulfate concentration of 120 to 180 g/l, the nickel chloride concentration of 35 to 55 g/l, the $H_3BO_3$, concentration of 3 to 5 g/l, the $H_3BO_3$ concentration of 2 to 4 g/l, the solution temperature of 70 to 95° C., pH of 0.5 to 1.5, and the current density of 5 to 50 A/dm². (ii) the nickel sulfate concentration of 180 to 280 g/l, the nickel chloride concentration of 30 to 50 g/l, the $H_3BO_3$ concentration of 16 to 25 g/l, the $H_3BO_3$ concentration of 1 to 5 g/l, the solution temperature of 45 to 65° C., and the current density of 5 to 50 A/dm². It is also possible to form a nickel-phosphorus alloy layer by the electroless plating method by using commercially available electroless plating solutions.

It is preferred that the nickel phosphorus alloy layer used in the present invention have the phosphorus contents of 0.05 wt % to 5 wt %. It might be thought that with a high-temperature load in the manufacturing process of a material for forming a capacitor layer and the popular manufacturing process of a printed wiring board, the phosphorus component in the nickel-phosphorus alloy layer diffuses into the dielectric layer. It may deteriorate the adhesion with the dielectric layer and also change the permittivity. However, it has become apparent that a nickel-phosphorus alloy layer having appropriate phosphorus content, improves the electrical properties as a capacitor. If the phosphorus content is less than 0.05 wt %, it is too low for nickel-phosphorus alloy layer to have properties close to those of the pure nickel layer, thermal expansion goes to large, the dielectric layer is damaged, and the nickel-phosphorus alloy layer cannot improve the electrical properties as a capacitor. In contrast to this, if the phosphorus content exceeds 5 wt %, phosphorus segregates at an interface of the dielectric layer, the adhesion with the dielectric layer deteriorates, and the nickel-phosphorus alloy layer becomes easy to peel off. Therefore, it is preferred that the phosphorus content is in the range of 0.05 wt % to 5 wt %. And in order to obtain more stable adhesion with the dielectric layer, the phosphorus content range of 0.2 wt % to 3 wt % enables a stable-quality capacitor circuit to be formed even if there are variations in the process to a certain degree. Incidentally, if an optimum range is to be consciously pointed out, phosphorus content range is from 0.25 wt % to 1.0 wt %, and in this range, it is possible to obtain the best adhesion with the dielectric layer and, at the same time, it is possible to obtain a good permittivity. Incidentally, the phosphorus content in the present invention is a value reduced on the basis of [P component weight]/[Ni component weight]×100 (wt %).

It is preferred that the nickel-phosphorus alloy layer in the material for forming a capacitor layer related to the present invention has a thickness of 0.1 µm to 2.0 µm. The thickness of the nickel-phosphorus alloy layer mentioned here is based on the nickel-phosphorus alloy composition in the above-described range. If the thickness of the nickel-phosphorus alloy layer is less than 0.1 µm, the phosphorus in the nickel-phosphorus alloy layer diffuses into the pure nickel layer to decrease the phosphorus content of the nickel-phosphorus alloy layer. It is too low content in the nickel-phosphorus alloy layer and properties may show close to those of the pure nickel layer. Therefore, thermal expansion becomes large, the dielectric layer is damaged, and the nickel-phosphorus alloy layer cannot improve the electrical properties as a capacitor. At the same time, a capacitor circuit formed may have insufficient quality stability. In contrast to this, if the thickness of the nickel-phosphorus alloy layer exceeds 2.0 µm, the total amount of phosphorus is too high even if the phosphorus is within the above-described range of phosphorus content. It may lose the significance of the presence of the pure nickel layer in the substrate. Therefore, in the same manner as in a case where only a nickel-phosphorus alloy layer is present the adhesion with the dielectric layer deteriorates and de-lamination may easily occur due to the segregation of phosphorus at the interface. And in order to obtain more stable adhesion with the dielectric layer, the range of the nickel-phosphorus alloy layer thickness of 0.5 µm to 1.5 µm enables a stable-quality capacitor circuit to be formed even if there are variations in the process to a certain degree. Incidentally, if an optimum range is to be consciously pointed out, it is possible to obtain the best adhesion with the dielectric layer and a good permittivity when the nickel-phosphorus alloy layer thickness is in the range of 0.8 µm to 1.2 µm.

It is preferred that the pure nickel layer in the material for forming a capacitor layer related to the present invention have thicknesses of 0.3 µm to 3.0 µm. It might be thought that this pure nickel layer, the nickel purity of which is not less than 99.9 wt %, performs the function of a diffusion barrier layer to prevent the copper component, which works as a decomposition catalyst of an organic component in the dielectric layer, from diffusing into the dielectric layer when subjected to high-temperature heating. Therefore, when the pure nickel layer thickness is less than 0.3 µm, the pure nickel layer cannot function as a diffusion barrier of the copper component. Even if the pure nickel layer's thickness exceeds 3.0 µm, there is no problem. However, if a heat cycle and temperatures applied in the manufacturing process of a material for forming a capacitor layer, and the popular manufacturing process of a printed wiring board are taken into consideration, the formation of nickel, which is relatively expensive, in thicknesses of not less than 3.0 µm, results in needless use of resources.

The material for the dielectric layer is not especially limited. Also for the method of forming the dielectric layer, it is possible to use various well known methods, such as the so-called sol-gel method or a coating method in which a dielectric-filler-containing organic resin solution which contains a dielectric filler and a binder resin is coated for forming a dielectric layer.

By using the above-described material for forming a capacitor layer related to the present invention, it becomes possible to form a bottom electrode having excellent adhesion with the dielectric layer. Also, the manufacturing method of a printed wiring board having an embedded capacitor circuit obtained by using the material for forming a capacitor layer related to the present invention is not especially limited, and it is possible to use any methods. However, as described in the following embodiment, it is desirable to use a manufacturing method of a printed wiring board which can remove an excess dielectric layer as much as possible except the dielectric layer in portions where a capacitor circuit is formed.

EMBODIMENT 1

Figure 3:
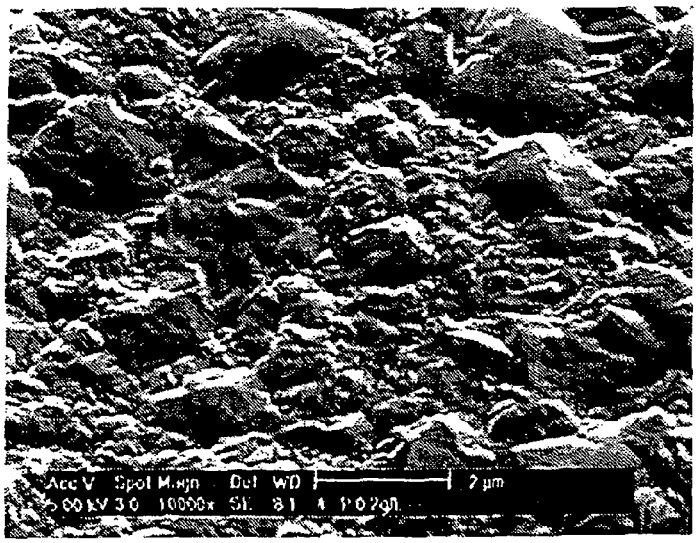
FIG. 3 is a scanning electron microscope image of an adhering surface of surface treated copper foil used as a second conductive layer (a nickel-phosphorus alloy layer) to a dielectric layer.

Production of surface treated copper foil used for the formation of a second conductive layer:

An about 2 µm thick pure nickel layer and an about 1.0 µm thick nickel-phosphorus alloy layer were formed on both surfaces of 35 µm thick electrodeposited copper foil by the electrolytic plating method. The phosphorus content in the nickel-phosphorus alloy layer at this time was 0.3 wt %. In the formation of the pure nickel layer, a nickel sulfate bath with the following conditions is used. A nickel sulfate concentration of 240 g/l, a nickel chloride concentration of 45 g/l, an $H_3BO_3$, concentration of 30 g/l, a solution temperature of 50° C., a pH of 4.5, and a current density of 5 A/dm². Then a 2 µm thick pure nickel layer was electrodeposited uniformly and smoothly on both surfaces of the electro deposited copper foil. For the nickel-phosphorus alloy layer, electrolysis was performed by using a phosphoric-acid-based solution with the following conditions. A nickel sulfate concentration of 250 g/l, a nickel chloride concentration of 40.39 g/l, an $H_3BO_3$ concentration of 19.78 g/l, $H_3BO_3$, concentration of 3 g/l, a solution temperature of 50° C., and a current density of 20 A/dm². Then an about 1 µm thick nickel-phosphorus alloy layer was electrodeposited uniformly and smoothly on the pure nickel layers formed by deposition on both surfaces of the electrodeposited copper foil. FIG. 3 shows the result of an observation of the surface state of the nickel-phosphorus alloy layer of the surface treated copper foil which is to be adhered with the dielectric layer.

Formation of Dielectric Layer:

A dielectric layer was formed by the sol-gel method on the surface of the nickel-phosphorus alloy layer present as an outer layer of the surface treated copper foil used for the formation of the above-described second conductive layer. The sol-gel method used here was performed by using a sol-gel solution, which was obtained by adding ethanolamine as a stabilizer to a methanol solution heated close to the boiling point in concentrations of 50 mol % to 60 mol % with respect to the total metal amount, followed by adding propanol solutions of titanium iso-propoxide and zirconium propoxide, and lead acetate, lanthanum acetate and nitric acid as a catalyst were added in order, and the solution is finally diluted to a concentration of 0.2 mol/l with methanol. This sol-gel solution was coated to the surface of the nickel-phosphorus alloy layer of the above-described surface treated copper foil by using a spin coater, followed by drying at 250° C. for 5 minutes in an environment of atmospheric air and thermal decomposition at 500° C. for 15 minutes in an environment of atmospheric air. Furthermore, film thickness adjustment was performed by repeating this coating process six times. Finally, baking treatment was performed at 600° C. for 30 minutes in an atmosphere where air is replaced with nitrogen to finish a dielectric layer. The composition ratio of the dielectric layer at this time was: Pb:La:Zr:Ti=1.1:0.05:0.52:0.48.

Production of Material for Forming a Capacitor Layer:

A 3 µm thick copper layer was formed as a first conductive layer by the sputtering deposition method on the dielectric layer formed as described above and a material for forming a capacitor layer having the first conductive layer and the second conductive layer on both surfaces of the dielectric layer was obtained. In this stage, interlayer dielectric strength was measured by applying a prescribed voltage. No shorting phenomenon was observed between the first conductive layer and the second conductive layer.

Figure 4:
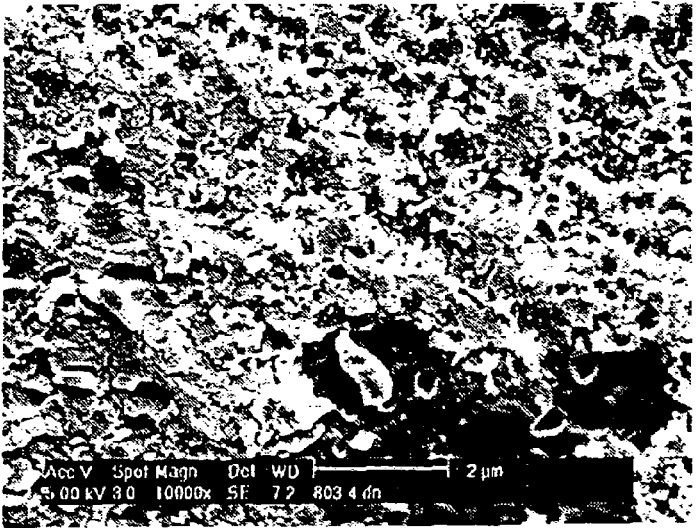
FIG. 4 is a scanning electron microscope image of the surface of a second conductive layer after peeling from a dielectric layer.
Figure 5:
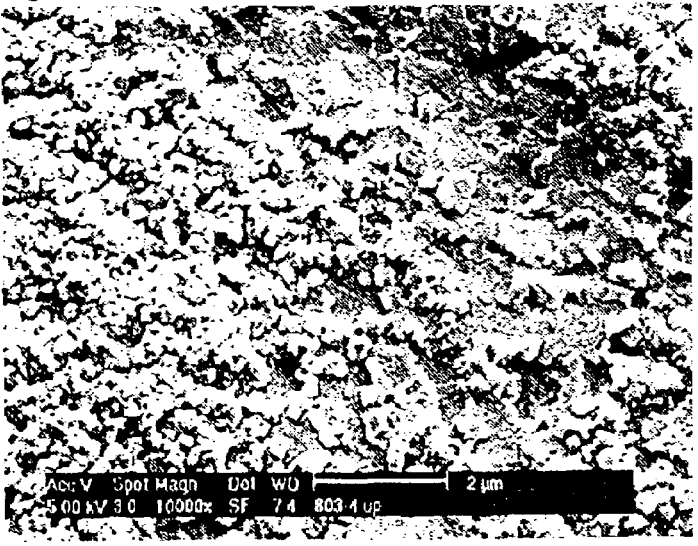
FIG. 5 is a scanning electron microscope image on the surface of a top electrode after peeling of a bottom electrode from a dielectric layer.
Figure 6:
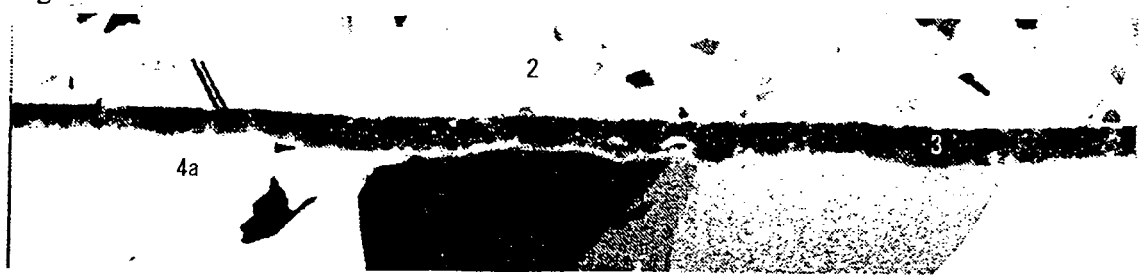
FIG. 6 is a cross-sectional SIM image of the interface showing adhesion between a second conductive layer and a dielectric layer.

In order to investigate the adhesion between the second conductive layer and the dielectric layer, the measurement of the peel strength at an interface between the second conductive layer and the dielectric layer and an observation of the interface were carried out. As a result, the peel strength was 12 g-f/cm, a high value when compared to the value of the following comparative example. FIG. 4 shows the state of the interface of the second conductive layer after peeling from the dielectric layer. To support the fact, in a comparison with FIG. 3, it is clearly found that the component in the dielectric layer remains on the surface of the second conductive layer which adhered to the dielectric layer. FIG. 5 shows a peeled surface of a top electrode after peeling of a bottom electrode from a dielectric layer, and the dielectric layer remains also on the peeled surface of the top electrode. It can be understood from this that breaking occurs in the dielectric layer due to peeling of the bottom electrode and de-lamination does not occur. Furthermore, FIG. 6 shows a cross-sectional SIM image of the state of adhesion between the second conductive layer and the dielectric layer. No abnormality is observed on the interface between the second conductive layer and the dielectric layer, and it became clear that a good interface is formed. The average capacitance density with the top electrode of 1 mm² area show 480 nF/cm², a very good value, and tan δ was 0.02. It is apparent that a good capacitor circuit having high capacitance and small dielectric loss was obtained.

Figure 7:
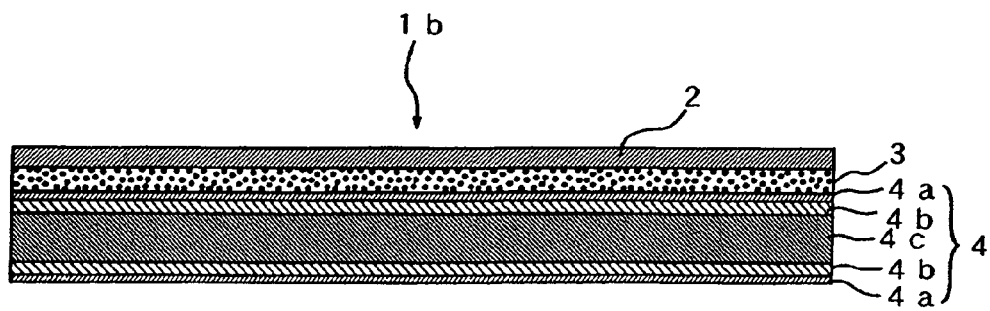
FIGS. 7 (a) to 7 (c) are schematic diagrams showing the manufacturing flow of a printed wiring board with embedded capacitor.
Figure 7:
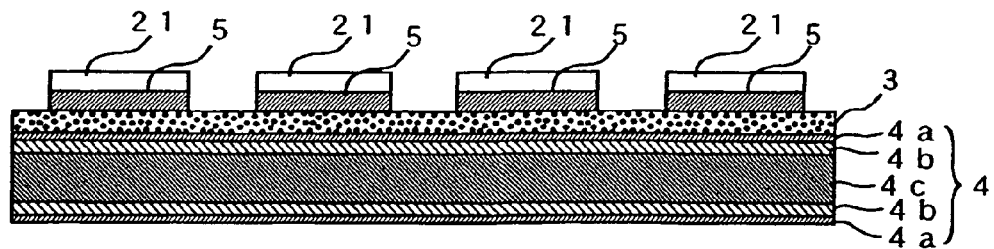
Figure 7:
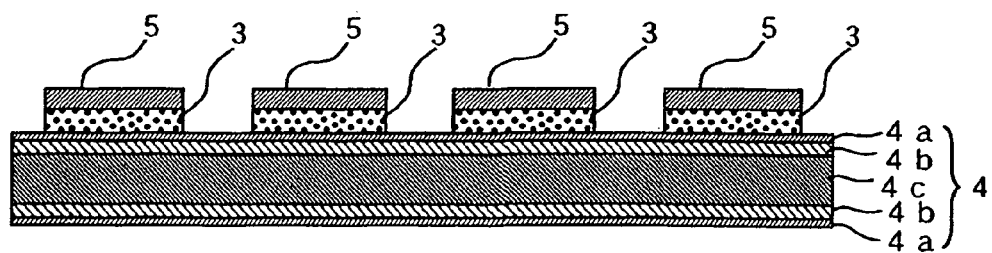

Manufacturing of Printed Wiring Board:

The first conductive layer on one side of the material for forming a capacitor layer 1b fabricated as described above, which is shown in FIG. 7(a), was polished, and a dry film was laminated on both surfaces of the first conductive layer to form an etching resist layer 21. An etching pattern for forming a top electrode was exposed and developed in the etching resist layer on the surfaces of the first conductive layer. And etching was performed by using a copper chloride etching solution and a top electrode 5 was formed as shown in FIG. 7(b).

After the formation of the top electrode 5, the exposed dielectric layer in areas other than the circuit portion was removed without removing the etching resist from the circuit surface. For removing the dielectric layer, wet-blast treatment was used. The slurry solution with abrasive concentration of 14 vol % used for wet-blast was obtained by dispersing an alumina abrasive which is a fine powder having a center particle size of 14 µm, in water. And the slurry solution was sprayed to collide against the surface to be polished as a high-speed water flow at a water pressure of 0.20 MPa from a slit nozzle having a length of 90 mm and a width of 2 mm to remove the unnecessary dielectric layer by polishing. After finishing of the wet-blast treatment, the etching resist was removed, followed by rinsing with water and drying, whereby the state shown in FIG. 7(c) was obtained.

Figure 8:
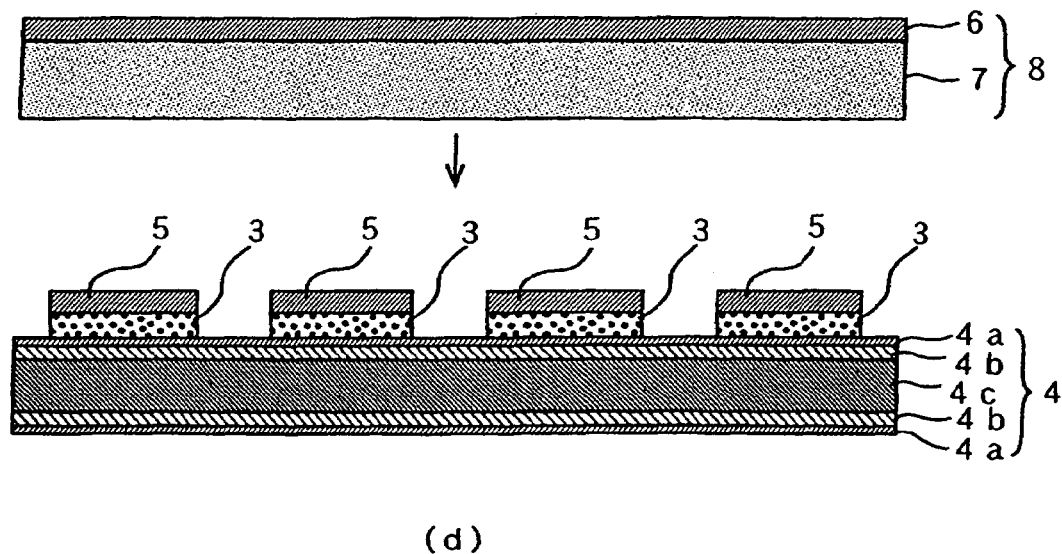
FIGS. 8 (l) to 8 (f) are schematic diagrams showing the manufacturing flow of a multilayer printed wiring board with embedded capacitor.
Figure 8:
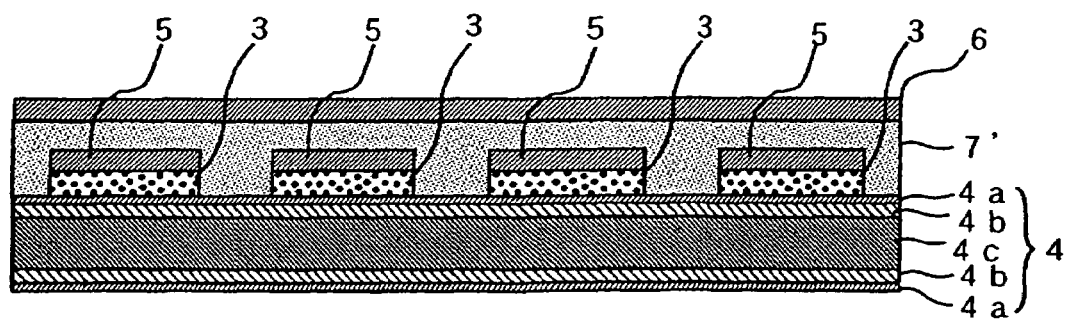
Figure 8:
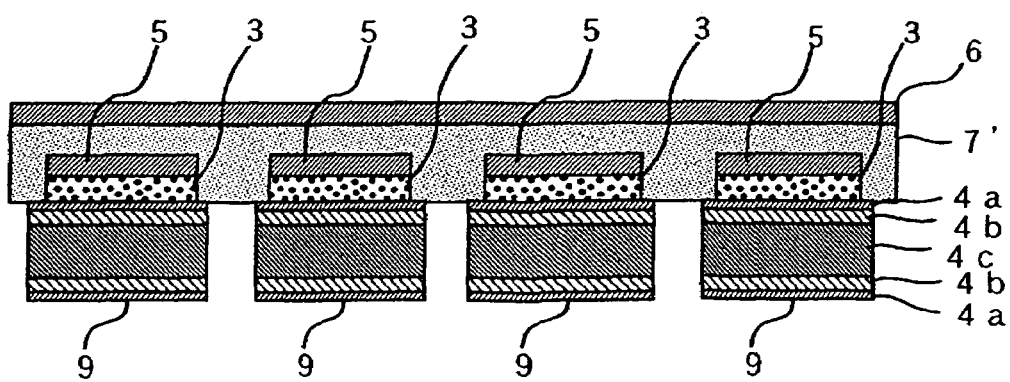

In the material for forming a capacitor layer, for which the above-described removal of the dielectric layer was finished, it is necessary to bury the gaps between the top electrodes which became deep by removing the exposed dielectric layer. Therefore, as shown in FIG. 8(d), in order to provide an insulating layer and a conductive layer on both sides of the material for forming a capacitor layer, copper foil with a resin layer 8 having an 80 µm thick semi-cured resin layer 7 on one surface of copper foil 6 was laid to laminate by hot press under the heating conditions of 180° C. for 60 minutes to obtain the state shown in FIG. 8(e) in which the copper foil layer 6 and an insulating layer 7' are laminated on the outer layer. The second conductive layer 4 of the outer layer shown in FIG. 8(e) was etched to form bottom electrode 9 and the state shown in FIG. 8 (f) was obtained.

Figure 9:
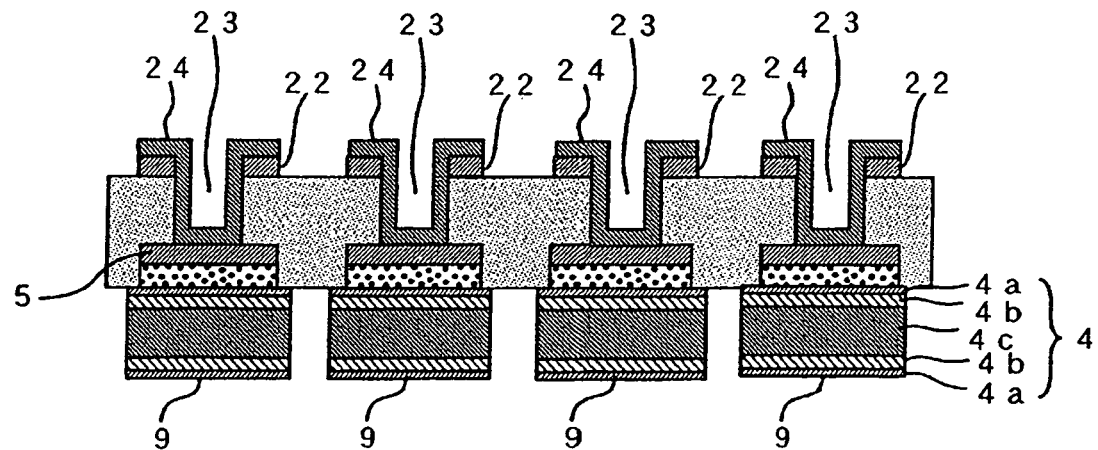
FIGS. 9 (g) and 9 (h) are schematic diagrams showing the manufacturing flow of a multilayer printed wiring board with embedded capacitor.
Figure 9:
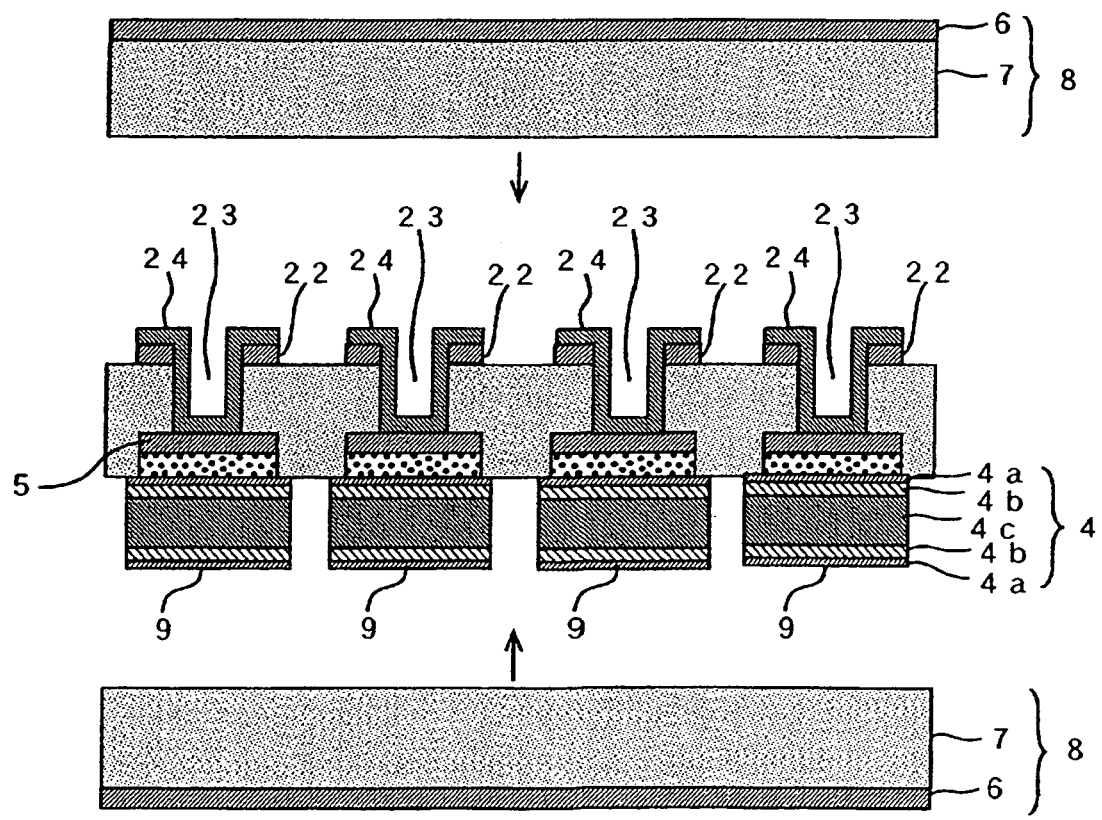

Next, in order to form an outer-layer circuit 22 and a via hole 23 in the copper foil layer 6 present in the outer layer, a plated copper layer 24 was formed by the conventional method and etching was performed, whereby the state shown in FIG. 9(g) was obtained. And as shown in FIG. 9 (h), the copper foil with a resin layer 8 was laid to laminate by hot press under the heating conditions of 180° C. for 60 minutes, and the copper foil layer 6 and the insulating layer 7' were laminated on the outer layer, whereby the state shown in FIG. 10(i) was obtained.

Figure 10:
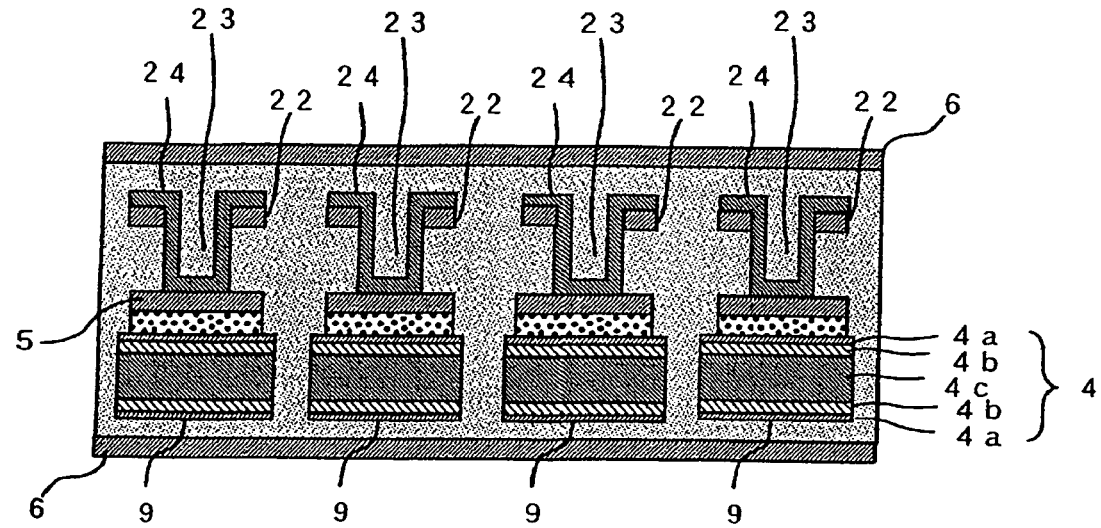
FIGS. 10 (i) and 10 (j) are schematic diagrams showing the manufacturing flow of a multilayer printed wiring board with embedded capacitor.
Figure 10:
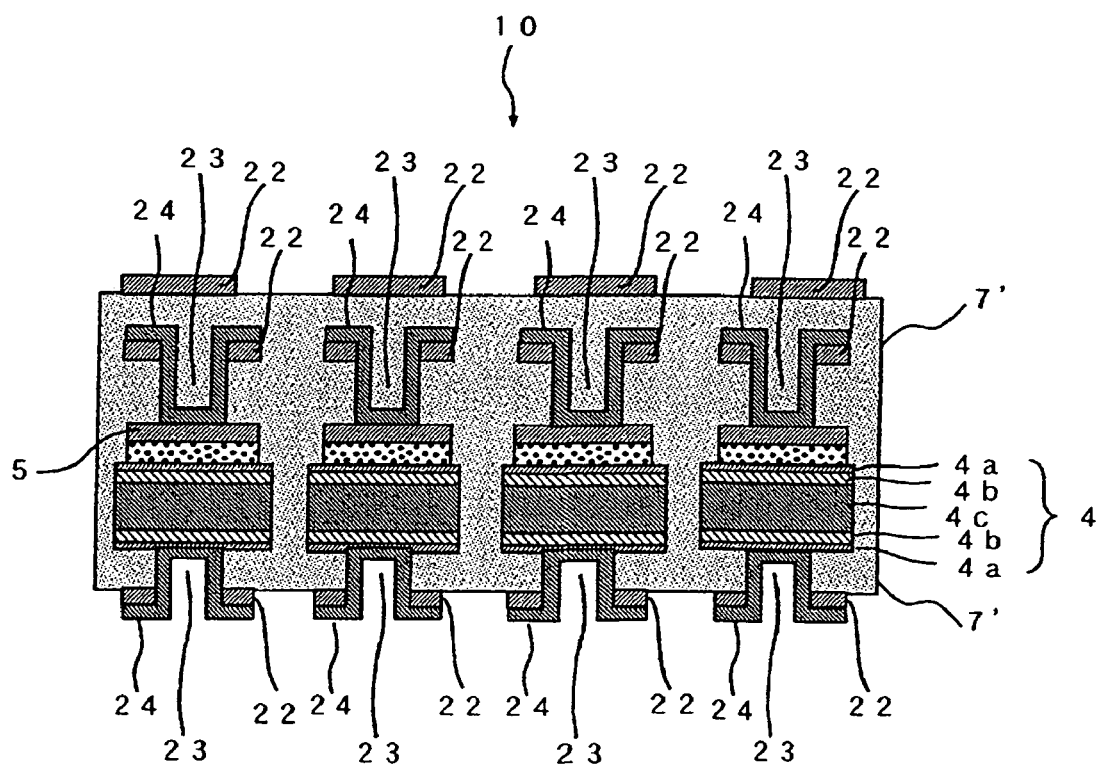

In order to form an outer-layer circuit 22 and a via hole 23 in the copper foil layer 6 of the outer layer shown in FIG. 10(i), a plated copper layer 24 was formed by the conventional method and etching was performed, whereby the state shown in FIG. 10(j) was obtained. Also in the etching method and in the formation of via holes and the like at this time, the conventional method was used. A printed wiring board 10 having an embedded capacitor circuit was manufactured as described above. As a result, the average capacitance density with the top electrode of 1 $mm^2$ area shows 480 $nF/cm^2$, a very good value, and tan δ was 0.02. It is apparent that a good capacitor circuit having high capacitance and small dielectric loss was obtained.

COMPARATIVE EXAMPLES

Comparative Example 1

The comparative example described below only differs from Embodiment 1 in the point that the surface treated copper foil constituting the second conductive layer in Embodiment 1 is formed with an about 3 μm thick pure nickel layer only. Therefore, descriptions on portions which may overlap will be omitted as much as possible.

For the production of the surface treated copper foil used for the formation of the second conductive layer, an about 3 μm thick pure nickel layer was formed by the electrolytic plating method on both surfaces of electrodeposited copper foil having a thickness of 35 μm. In the formation of the pure nickel layer, the same conditions as in Embodiment 1 were used. Although the state of the surface of the surface treated copper foil laminated on the dielectric layer at this stage was observed, it was similar to the state shown in FIG. 3 and, therefore, a scanning electron microscope image of this surface state was omitted.

A material for a capacitor layer was formed by forming a dielectric layer by the sol-gel method in the same manner as in Embodiment 1, and after that, a material for forming capacitor layer having a first conductive layer and a second conductive layer on both surfaces of the dielectric layer was obtained. The interlayer dielectric strength was measured at this stage. The shorting phenomenon was determined between the first conductive layer and the second conductive layer and the product yield was 60%.

Figure 11:
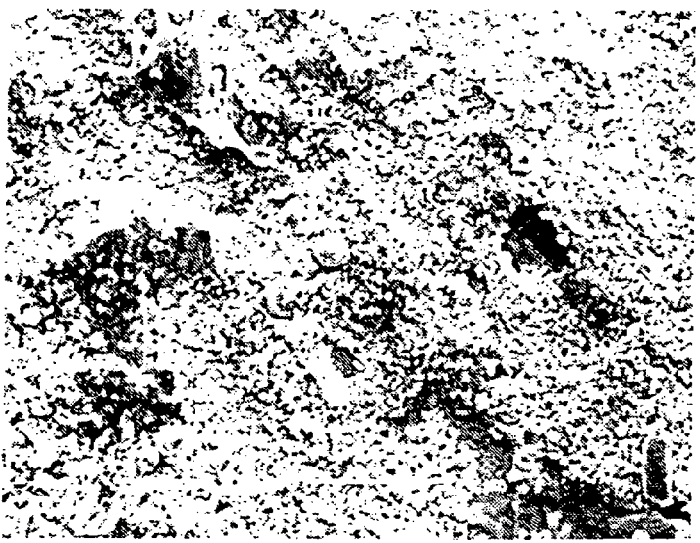
FIG. 11 is a scanning electron microscope image of the surface of a second conductive layer after peeling from a dielectric layer.
Figure 12:
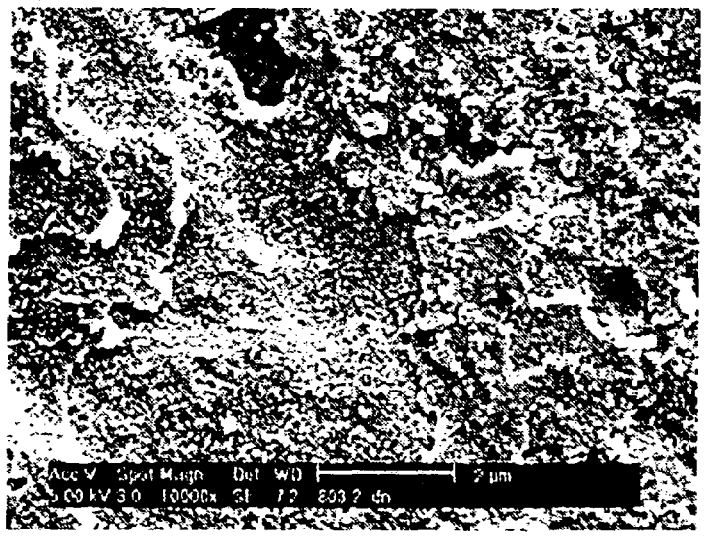
FIG. 12 is a scanning electron microscope image of a top electrode after peeling of a bottom electrode from a dielectric layer.
Figure 13:
FIG. 13 is a cross-sectional SIM image of the interface showing adhesion between a second conductive layer and a dielectric layer.

In order to investigate the adhesion between the second conductive layer and the dielectric layer, the measurement of the peel strength at an interface between the second conductive layer and the dielectric layer and an observation on the interface were carried out. As a result, the peel strength was 7 g-f/cm. Although it is an acceptable level of peel strength, the value is lower when compared to the value of the above-described embodiment. To support the fact, FIG. 11 shows the state of the interface of the second conductive layer after peeling from the dielectric layer and FIG. 12 shows the peeled surface of the first conductive layer on the opposite side. However, it is apparent that the separated state of the peeled surface of the second conductive layer adhering to the dielectric layer is different, far from the case of FIGS. 4 and 5. Furthermore, FIG. 13 shows a cross-sectional SIM image of the state of adhesion between the second conductive layer and the dielectric layer. Many void-like defects were observed at the interface between the second conductive layer and the dielectric layer and it became clear that good adhesion will not be obtained from such interface.

Incidentally, by using the material for forming a capacitor layer fabricated in Comparative Example 1, a printed wiring board having an embedded capacitor was manufactured in the same manner as in Embodiment 1. As a result, the average capacitance density with an electrode area of 1 $mm^2$ was 350 $nF/cm^2$ and tan δ was 0.092. Compared to the embodiment, the printed wiring board is inferior in both capacitance and dielectric loss.

Comparative Example 2

The comparative example described below only differs from Embodiment 1 in that the surface treated copper foil constituting the second conductive layer in Embodiment 1 is formed with an about 3 μm thick nickel-phosphorus alloy layer only. Therefore, descriptions on portions which may overlap will be omitted as far as possible.

For the production of the surface treated copper foil used for the formation of the second conductive layer, an about 3 μm thick nickel-phosphorus alloy layer was formed by the electrolytic plating method on both surfaces of electrodeposited copper foil having a thickness of 35 μm. In the formation of the nickel-phosphorus alloy layer, the same conditions as in Embodiment 1 were used. The state of the surface of the surface treated copper foil laminated on the dielectric layer at this stage was observed. It was similar to the state shown in FIG. 3 and, therefore, a scanning electron microscope image of this surface state was omitted.

A material for forming a capacitor layer was produced by forming a dielectric layer by the sol-gel method in the same manner as in Embodiment 1, and after that, a material for forming a capacitor layer having a first conductive layer and a second conductive layer on both surfaces of the dielectric layer was obtained. The interlayer dielectric strength was measured at this stage. The short phenomenon between the first conductive layer and the second conductive layer was not found.

Figure 14:
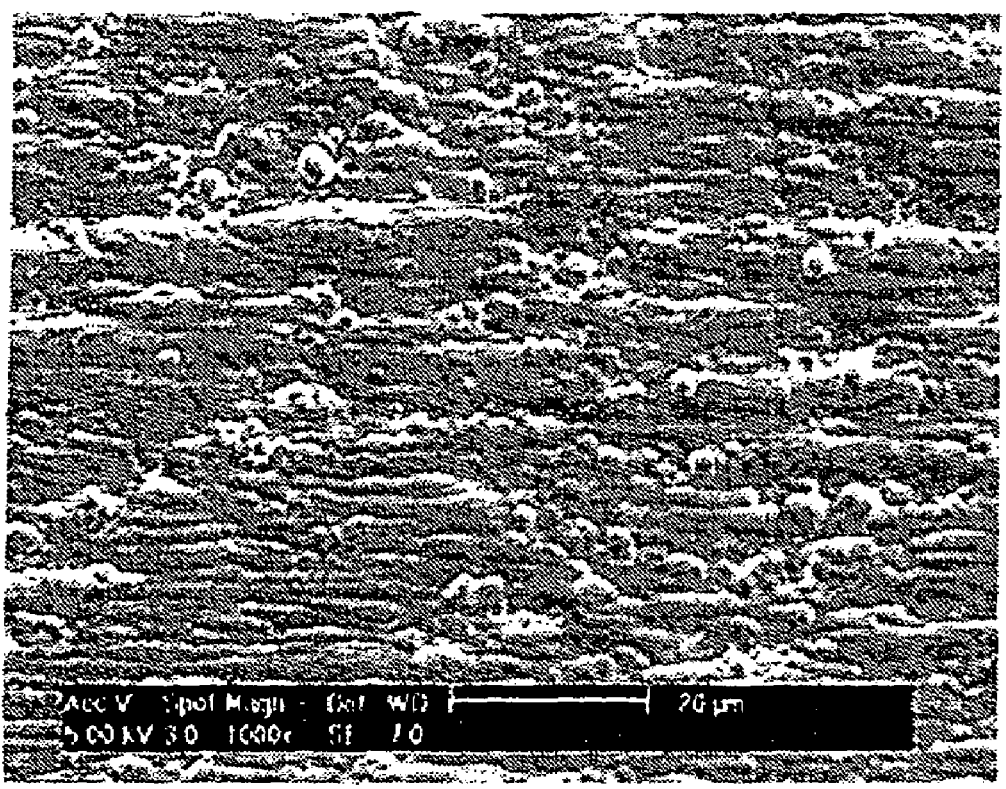
FIG. 14 is a scanning electron microscope image of the surface of a second conductive layer after peeling from a dielectric layer.
Figure 15:
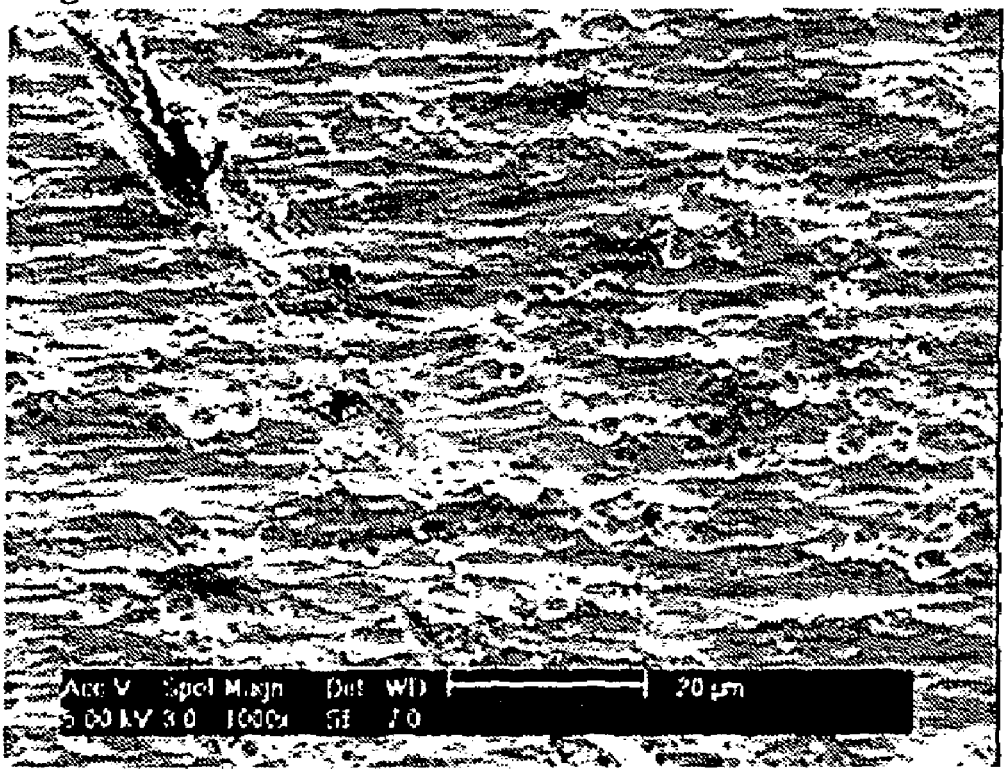
FIG. 15 is a scanning electron microscope image of a surface of a top electrode after peeling of a bottom electrode from a dielectric layer.

In order to investigate the adhesion between the second conductive layer and the dielectric layer, the measurement of the peel strength at an interface between the second conductive layer and the dielectric layer, and an observation of the interface were carried out. As a result, the peel strength was 2 g-f/cm. This is a very low value when compared to the value of the above-described embodiment. To support this fact, FIG. 14 shows the state of the interface of the second conductive layer after peeling from the dielectric layer and FIG. 15 shows the peeled surface of the first conductive layer on the opposite side. As shown in FIG. 14, a very small amount of the dielectric layer remains on the interface of the second conductive layer after peeling from the dielectric layers and it became apparent that the dielectric layer remains on the first conductive layer side in FIG. 15. Furthermore, as a result of an observation of a cross-sectional SIM image of the state of adhesion between the second conductive layer and the dielectric layer, good adhesion was not obtained although void-like defects are not observed at the interface between the second conductive layer and the dielectric layer as in FIG. 6.

Incidentally, by using the material for forming a capacitor layer produced in Comparative Example 2, a printed wiring board having an embedded capacitor was manufactured in the same manner as in Embodiment 1. As a result, the average capacitance density with the top electrode of 1 $mm^2$ area was 450 $nF/cm^2$ and tan δ was 0.03. Compared to the embodiment, the printed wiring board is inferior in both capacitance and dielectric loss.

INDUSTRIAL APPLICABILITY

The material for forming a capacitor layer related to the present invention is characterized by the conductive layer for forming the bottom electrode. And by using this material for forming a capacitor layer, the average capacitance density and tan δ of a formed capacitor circuit can be excellent and the adhesion between the dielectric layer and the bottom electrode increases. Therefore, the quality deterioration of a material for forming a capacitor layer does not occur easily in the manufacturing process of both a material for forming a capacitor layer and a printed wiring board having an embedded capacitor circuit. The degree of freedom in the line design of a printed wiring board manufacturing process is improved, and the quality of a printed wiring board is also substantially improved.

DESCRIPTION OF SYMBOLS 1a, 1b, 1c Material for forming a capacitor layer
2 First conductive layer
3 Dielectric layer
4 Second conductive layer
4a Nickel-phosphorus alloy layer
4b Pure nickel layer
4c Copper layer
5 Top electrode
6 Copper foil (layer)
7 Semi-cured resin layer
8 Copper foil with a resin layer
9 Bottom electrode
10 Printed wiring board
21 Etching resist
22 outer-layer circuit
23 Via hole
24 Plated copper layer

The invention claimed is:

1. A material for forming a capacitor layer of a printed wiring board which has a dielectric layer between a first conductive layer forming a top electrode and a second conductive layer for forming a bottom electrode, wherein the second conductive layer is a conductive layer in which a pure nickel layer and a nickel-phosphorus alloy layer are deposited in order on a surface of a copper layer.

2. The material for forming a capacitor layer according to claim 1, which is characterized in that the nickel-phosphorus alloy layer has phosphorus contents of 0.05 wt % to 5 wt %.

3. The material for forming a capacitor layer according to claim 1, which is characterized in that the nickel-phosphorus alloy layer has thicknesses of 0.1 μm to 2.0 μm.

4. The material for forming a capacitor layer according to claim 1, which is characterized in that the pure nickel layer has thicknesses of 0.3 μm to 3.0 μm.

5. A printed wiring board having an embedded capacitor circuit obtained by using the material for forming a capacitor layer according to claim 1.

6. A material for forming a capacitor layer of a printed wiring board which has a dielectric layer between a first conductive layer forming a top electrode and a second conductive layer forming a bottom electrode, wherein the second conductive layer is a conductive layer in which a nickel-phosphorus alloy layer, a pure nickel layer and a nickel-phosphorus alloy layer are deposited in order on a surface of a copper layer.

7. A material for forming a capacitor layer of a printed wiring board which has a dielectric layer between a first conductive layer forming a top electrode and a second conductive layer for forming a bottom electrode, wherein the second conductive layer is a conductive layer in which a pure nickel layer and a nickel-phosphorus alloy layer are deposited in order on one or both surfaces of a copper layer.

* * * * *